United States Patent [19]
Kaiser

[11] Patent Number: 5,418,751
[45] Date of Patent: May 23, 1995

[54] VARIABLE FREQUENCY OSCILLATOR CONTROLLED EEPROM CHARGE PUMP

[75] Inventor: Ulrich Kaiser, Warstein, Germany

[73] Assignee: Texas Instruments Incorporated, Dallas, Tex.

[21] Appl. No.: 129,214

[22] Filed: Sep. 29, 1993

[51] Int. Cl.$^6$ .............................................. G11C 7/04
[52] U.S. Cl. ................................. 365/211; 365/212; 365/226; 327/513
[58] Field of Search .................... 365/211, 212, 189.09, 365/226; 307/310, 296

[56] References Cited

U.S. PATENT DOCUMENTS

| | | | |
|---|---|---|---|
| 3,701,004 | 10/1972 | Tuccinardi | 307/310 |
| 3,713,033 | 1/1973 | Frerking | 307/310 |
| 3,725,789 | 4/1973 | Mager | 307/310 |
| 5,053,774 | 10/1991 | Schuermann et al. | 342/44 |
| 5,173,876 | 12/1992 | Kawashima et al. | 365/189.07 |
| 5,197,033 | 3/1993 | Watanabe et al. | 365/226 |
| 5,200,654 | 4/1993 | Archer | 307/310 X |

Primary Examiner—Joseph A. Popek
Assistant Examiner—Son Dinh
Attorney, Agent, or Firm—Richard A. Stoltz; James Kesterson; Richard Donaldson

[57] ABSTRACT

Semiconductor circuit provides an EEPROM programming charge pump (18), and includes a leakage current measuring device (12), a plurality of interconnected current mirrors, and a current controlled oscillator (16) for providing programming power to such EEPROM. The leakage current sensor (12) generates current nonlinearly related to device ambient temperature of the semiconductor circuit, the current mirrors combining and scaling the leakage current (14) with a constant current to provide a composite current altering frequency of the oscillator (16). The oscillator output is constrained accordingly to provide EEPROM charge pump (18) programming power proportional to the oscillator (16) frequency for ensuring that only that amount of programming power appropriate to the ambient temperature is delivered, achieving high economy of total EEPROM programming power utilization, as for an EEPROM of a miniaturized, self-contained responder of a read/write transponder system resident on a single semiconductor integrated circuit chip.

9 Claims, 1 Drawing Sheet

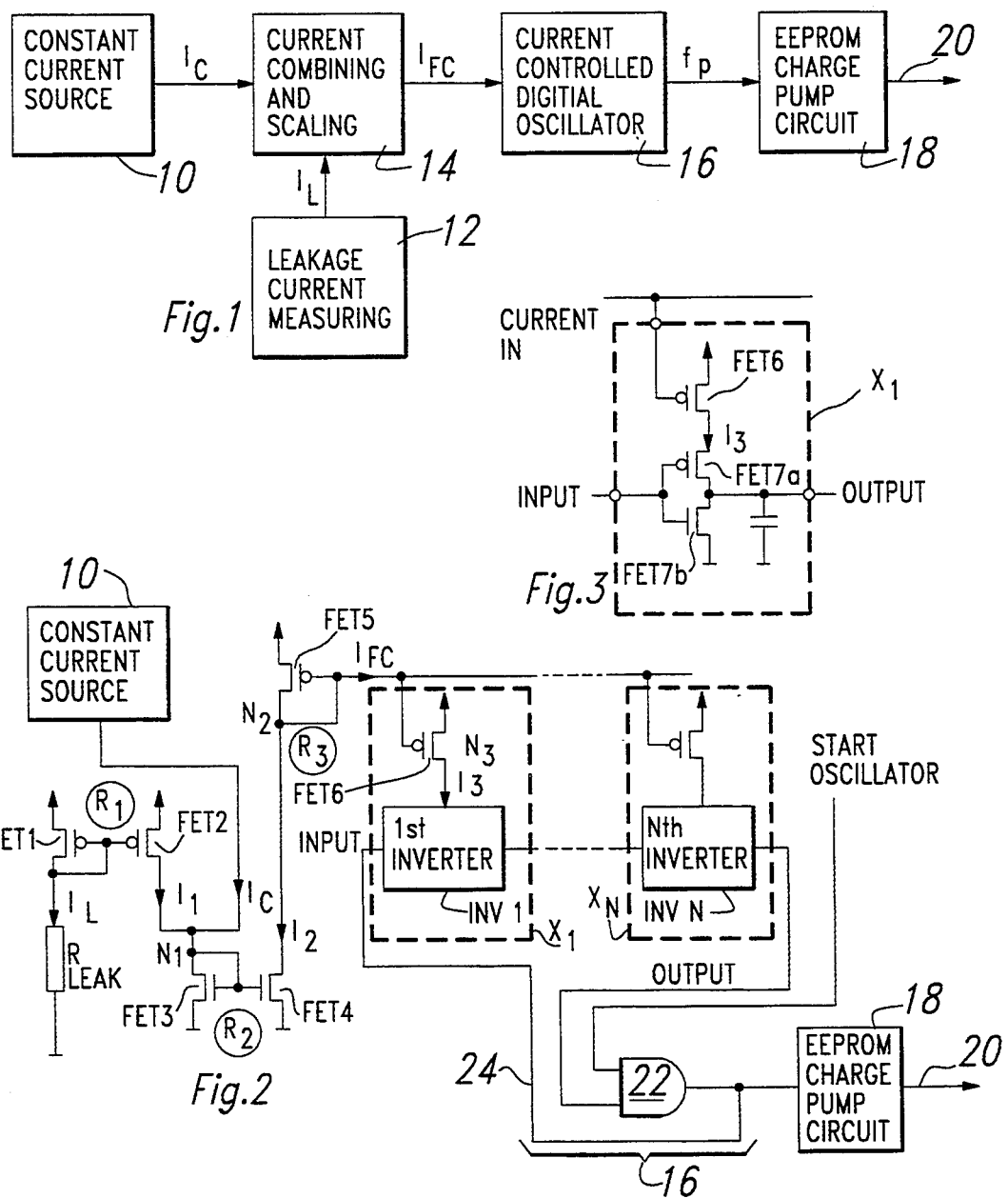

ered satisfactorily at room temperatures; yet as temperature increases, the leakage current increases, with the consequence that the remaining programming current decreases and so also does the programming voltage with the consequence that the EEPROM programming will not be performed properly.

VARIABLE FREQUENCY OSCILLATOR CONTROLLED EEPROM CHARGE PUMP

BACKGROUND OF THE INVENTION

Field of the Invention

The invention relates to a variable frequency digital oscillator which is used to control the programming voltage and current required by an Electrically Erasable and Programmable Read-Only Memory, herein referred to as an EEPROM, and particularly to an EEPROM charge pump using such a variable frequency digital oscillator which is of high efficiency to provide extreme economy in power utilization.

Background of the Invention

In known EEPROM devices, the programming current is provided by a fixed frequency oscillator powered by a stabilized voltage source and a charge pump. The power source and oscillator are designed taking into consideration worst case ambient temperature conditions. Further, in known EEPROM technology, the current-supplying capability of the power source, whether battery or utility, being typically stable, is not usually an important design consideration.

In EEPROM applications wherein conventional power sources are not available, specifically in transponder designs which use self-powered sources, economy in power utilization may be necessary. An example of a device wherein extreme economy must be achieved in order that a transmitted program may be stored effectively and free from errors follows. More specifically, such a device may be a miniaturized, a self-contained read/write transponder system employing an interrogator and responder arrangement, in which the responder has an EEPROM and a charge pump (for delivering the necessary programming voltage/current), and utilizes a small capacitor as an energy accumulator charged by the energy of radio frequency interrogation, to provide a power source for the responder. A source of power loss in such a power-critical and thus demanding EEPROM technology application is semiconductor leakage current. Such leakage current is device temperature sensitive; it characteristically doubles for every 8° K. (Kelvin) to 10° K rise in device ambient temperature. Such a transponder arrangement is disclosed in co-assigned Schuermann et al U.S. Pat. No. 5,053,774.

In such a device, the programming voltage/current provided by an on-chip oscillator charge pump is delivered satisfactorily at room temperatures; yet as temperature increases, the leakage current increases, with the consequence that the remaining programming current decreases and so also does the programming voltage with the consequence that the EEPROM programming will not be performed properly.

Accordingly, among the several objects of the present invention are to provide an improved control circuit and semiconductor oscillator circuit, viz., of variable frequency digital type, with an EEPROM chip charge pump, which circuit is also controlled by the temperature dependent leakage current on the chip; which delivers EEPROM programming voltage/current in precisely compensated manner satisfactorily with increasing room temperatures so that programming of the EEPROM will be performed properly regardless of such increases of temperature; which will not generate more programming current than necessary for a given temperature; which operates with extreme efficiency from a very limited source of power such as small capacitor charged by the energy of radio frequency interrogation; which will not consume more current from the power supply than needed; and which permits multiple factors to provide selective variable parametric adaption of the circuit's performance to different EEPROM characteristics, e.g., memory sizes.

Thus, among other objects of the invention may be noted the provision of such an oscillator circuit to serve an EEPROM charge pump by providing a programming voltage generator which delivers only that programming current required by the EEPROM at a given ambient temperature, and such that, if the ambient temperature should rise or fall, the charge pump output is constrained to supply a higher or lower programming current, the magnitude of which depends on the relationship between device ambient temperature and leakage current.

SUMMARY OF THE INVENTION

Briefly, a semiconductor circuit of the invention is employed for providing an EEPROM programming charge pump, and comprises a leakage current sensing means, responsive to ambient temperature of the circuit, a current controlled oscillator, and means, responsive to the leakage current sensing means, for altering the frequency of the current controlled oscillator as a nonlinear function of change in the ambient temperature such that the output of the oscillator is contrained accordingly for providing EEPROM programming power at a level appropriate to the ambient temperature whereby to achieve high economy of total EEPROM programming power utilization. More specifically, current mirrors combine and scale the leakage current with a constant current to provide a composite current altering the oscillator frequency such that the alteration doubles for each 8° K.–10° K. rise in ambient temperature. EEPROM charge pump programming power is proportional to the oscillator frequency.

The EEPROM may be that of a miniaturized, self-contained responder of a read/write transponder system, where the responder is resident on a single semiconductor integrated circuit chip, and on which the charge pump delivers to the EEPROM the necessary programming voltage/current and utilizing a small capacitor which is charged by the energy of radio frequency interrogation as the sole responder power source for read/write transponder operation.

Other objects and features will be apparent or are pointed out below.

BRIEF DESCRIPTION OF THE DRAWINGS

FIG. 1 is a block diagram of a variable frequency digital oscillator for providing an EEPROM charge pump in accordance with the present invention, as illustrated in very simplified manner.

FIG. 2 is a schematic circuit diagram thereof.

FIG. 3 is a schematic circuit diagram of a ring oscillator circuit section, being one of an array of such sections.

Corresponding numerals indicate corresponding elements among the views of the drawings.

DESCRIPTION OF THE PREFERRED EMBODIMENT

FIG. 1 shows the functional circuit elements of the preferred semiconductor circuit embodiment of the invention, as realized by circuit structure design in a single semiconductor chip to be employed, for example, in a miniaturized, self-contained responder of a read/write transponder system, the responder having an integrated circuit chip device for which a small capacitor (not shown) is charged by the energy of radio frequency interrogation as sole power source for read/write transponder operation, as in accordance with above-identified Schuermann et al U.S. Pat. No. 5,053,774, which is herein incorporated by reference which indicates such a capacitor, wherein the charge pump delivers to the EEPROM the necessary programming voltage/current.

A conventional constant current source 10 is provided by the EEPROM chip power supply. A leakage current sensing means, namely leakage current measuring device 12 generates a current $I_1$ with the correct degree of nonlinearity as a function of the device ambient temperature. A current combining and scaling means 14 combines the output of the constant current source and the sensed leakage current. This composite output is used as the frequency control current $I_{FC}$ for a current controlled digital oscillator 16.

The variable frequency output, having frequency $f_P$ of oscillator 16, where fp is a function of both $I_C$ and $I_L$, is then converted to variable programming power by an EEPROM charge pump circuit 18 for EEPROM programming according to known device technique.

FIG. 2 shows the implementation of the invention in summary schematic form. Integrated circuit structures designated $R_1$, $R_2$, $R_3$ are Metal Oxide Silicon ("MOS") field effect transistors ("FET") devices resident on the EEPROM chip. These FET devices, as so configured, will be understood by those skilled in the art to be configured current mirrors. A current mirror is a circuit that generates a current which flows into or out of a node and which is a ratio R of another current flowing into or out of a different node. In FIG. 2, $N_1$, $N_2$ and $N_3$ are three such nodes.

In the embodiment shown in FIG. 2, a leakage current $I_L$, shown to flow through a leakage resistance R which is intrinsically characteristically variable as a function of and sensitive to the temperature of the EEPROM, enters a current mirror with a ratio $R_1$. Such current mirror is formed of PMOS devices FET1 and FET2. The exit current $I_1$ therefore has a magnitude of $I_L R_1$. Current $I_1$ enters node $N_1$ together with a current $I_C$, derived from constant current source 10. This current is ratioed by the factor $R_2$ provided by NMOS devices FET3 and FET4. The current $I_2$ entering node $N_2$ through a PMOS device FET5 is in turn ratioed by factor $R_3$.

Within a first ring oscillator section $X_1$, the combined current $I_3$ which exits from node $N_3$ is therefore a scaled replica of the combined currents $I_L$, which is device leakage current, and $I_C$, the constant current previously referred to. The magnitude of the current $I_3$ is therefore given by the expression:

$$I_3 = R_3 R_2 R_1 I_L + R_3 R_2 I_C$$

This composite current is used advantageously to control the frequency of the ring oscillator 16.

Oscillator 16 is formed conventionally of an array of inverter stages $X_1, \ldots X_N$, each of the form shown in FIG. 3, wherein stage $X_1$ is typical. Thus in stage $X_1$, FET6 forms a current controller with node current $I_3$ flowing through an interconnected pair of MOS devices FET7a and FET7b which thus together effectively provide an inverter INV1 with respect to the input and output, so designated. A capacitor C determines the time constant of the circuit thus provided. The frequency of ring oscillator 16 is determined by the number of inverter elements, i.e., stages $X_1, \ldots X_N$, and the propagation delay of signals passing along the array. The propagation delay, and therefore oscillator frequency, may also be modified by controlling the amount of current supplied to the inverter elements.

An AND gate 22 is used for selectively controlling the starting and stopping of oscillator 16 by having one input connected to the output of oscillator 16. The output of AND gate 22 when enabled in response to a signal "START-OSCILLATOR" provided to another input of the AND gate provides feedback via a connection 24 to the input of oscillator stage $X_1$ for oscillator operation and delivery accordingly also of the output frequency of oscillator 16 to EEPROM charge pump 18.

When oscillator 16 is thus enabled, it operates in response to current $I_3$ in order advantageously to control oscillator frequency as a function of temperature in accordance with the invention.

A second advantageous use of current $I_3$ is that the scale factors $R_1$, $R_2$ and $R_3$ may be easily and readily changed to accommodate different EEPROM memory sizes without otherwise requiring circuit modification.

Since semiconductor device leakage current doubles for each 8°–10° K. rise in temperature, and the components and scale factors associated with current $I_3$ can appropriately compensate for such temperature rises, the goal of supplying the required programming current needed specifically at the microchip ambient temperature, is thus achieved most simply and efficiently.

Operation is thereby achieved by operating the EEPROM digital oscillator over a range of frequencies rather than at a fixed frequency as in other known applications, and wherein the FET devices of the chip are employed as means for sensing the magnitude of device leakage current in order to control the frequency of the digital oscillator.

The variable digital oscillator output is converted to this programming voltage and current by charge pump circuit 18, the latter being thus a frequency-to-current converter. The charge pump output is the source of programming power to the EEPROM.

In operation, as the device ambient temperature rises, the oscillator frequency also rises, thus increasing the programming voltage and current output of the charge pump. Conversely, the programming voltage and current falls as the device ambient temperature falls.

By virtue of the operation of the leakage current sensing device and the variable frequency digital oscillator, both of which are implemented as microcircuit structures on the semiconductor EEPROM chip, the desired aim of programming current economy for EEPROM charge pump function is achieved.

Such economy of charge pump power is of marked advantage when the present semiconductor circuit wherein the semiconductor circuit is that of a read/write transponder including a capacitor charged by the energy of radio frequency interrogation as sole power source for read/write transponder operation.

Thus it is seen in summary that there is achieved an advantageous semiconductor circuit for providing an EEPROM programming charge pump including a current controlled oscillator for providing programming power to such an EEPROM, the improvement comprising a leakage current sensing means, responsive to ambient temperature of the circuit, and means, responsive to the leakage current sensing means, for altering frequency of the oscillator as a nonlinear function of rise in the ambient temperature such that the output of the oscillator is constrained accordingly for providing EEPROM programming power at a level appropriate to the ambient temperature whereby to achieve high economy of total EEPROM programming power utilization.

In view of the foregoing, it will be seen that the several objects of the invention are achieved and other advantages are attained.

Although the foregoing includes a description of the best mode contemplated for carrying out the invention, various modifications are contemplated.

As various modifications could be made in the constructions herein described and illustrated without departing from the scope of the invention, it is intended that all matter contained in the foregoing description or shown in the accompanying drawings shah be interpreted as illustrative rather than limiting.

What is claimed is:

1. Semiconductor circuit comprising an EEPROM programming charge pump, a current controlled oscillator for providing power to such an EEPROM charge pump, leakage current sensing means, responsive to ambient temperature of the circuit, and means, responsive to the leakage current sensing means, for increasing frequency of the oscillator as a nonlinear function of rise in the ambient temperature such that the output frequency of the oscillator is constrained accordingly for providing EEPROM charge pump power at a level appropriate to the ambient temperature whereby to achieve high economy of total EEPROM programming power utilization.

2. Semiconductor circuit according to claim 1, the leakage current sensing means comprising a leakage current measuring device for generating a leakage current signal which increases as a nonlinear function of the device ambient temperature, the means responsive to the leakage current sensing comprising a plurality of interconnected current mirrors, the current mirrors combining and scaling the leakage current with a constant current to provide a composite current for controlling oscillator frequency.

3. Semiconductor circuit according to claim 2, wherein the means for measuring leakage current comprises a MOSFET device of the semiconductor circuit.

4. A semiconductor circuit as set forth in claim 1 wherein the semiconductor circuit is that of a read/write transponder including a capacitor charged by the energy of radio frequency interrogation as sole power source for read/write transponder operation.

5. A semiconductor circuit for providing a programming charge pump for an EEPROM, the circuit comprising a leakage current measuring means which is responsive to ambient temperature of the circuit, a plurality of interconnected current mirrors, and a current controlled oscillator for providing programming power to such an EEPROM, the leakage current measuring device generating a current nonlinearly related to device ambient temperature of the semiconductor circuit, the current mirrors combining and scaling the leakage current with a constant current to provide a composite current which increases the frequency of the oscillator, the output frequency of the said oscillator being constrained accordingly for providing EEPROM charge pump programming power in proportion to the oscillator frequency for ensuring that only that amount of programming power appropriate to the ambient temperature is delivered, whereby to achieve high economy of total EEPROM programming power utilization.

6. A semiconductor circuit as set forth in claim 5, wherein the leakage current measuring means measures the leakage current of an EEPROM device of the semiconductor circuit.

7. A semiconductor circuit as set forth in claim 6, wherein the leakage current measuring means comprises a MOSFET device of the semiconductor circuit.

8. A semiconductor circuit as set forth in claim 6, wherein the current mirrors are constituted by pairs of MOSFET devices of the semiconductor circuit.

9. A semiconductor circuit as set forth in claim 8, the oscillator comprising a current controlled digital ring oscillator which is frequency controlled in response to the composite current.

* * * * *